United States Patent
Schwab et al.

(10) Patent No.: US 7,491,783 B2
(45) Date of Patent: *Feb. 17, 2009

(54) PROCESS FOR HIGHLY PURIFIED POLYHEDRAL OLIGOMERIC SILSESQUIOXANE MONOMERS

(76) Inventors: Joseph J. Schwab, 18237 Mt. Baldy Cir., Fountain Valley, CA (US) 92708; Yi-Zhong An, 12 Walnut Creek, Irvine, CA (US) 92602; Sanjay Malik, 40 Gaywood Ave., Attleboro, MA (US) 02703; Binod B. De, 63 Thomas Olney Commons, Providence, RI (US) 02904

(*) Notice: Subject to any disclaimer, the term of this patent is extended or adjusted under 35 U.S.C. 154(b) by 174 days.

This patent is subject to a terminal disclaimer.

(21) Appl. No.: 11/297,190

(22) Filed: Dec. 7, 2005

(65) Prior Publication Data

US 2007/0065750 A1   Mar. 22, 2007

Related U.S. Application Data

(60) Provisional application No. 60/634,249, filed on Dec. 7, 2004.

(51) Int. Cl.
*C08G 77/08* (2006.01)

(52) U.S. Cl. .......................................... 528/23; 528/34
(58) Field of Classification Search .................. 528/23, 528/34

See application file for complete search history.

(56) References Cited

U.S. PATENT DOCUMENTS

| 5,412,053 | A | 5/1995 | Lichtenhan et al. |
| 5,484,867 | A | 1/1996 | Lichtenhan et al. |
| 6,054,548 | A | 4/2000 | Currie et al. |
| 2003/0055193 | A1* | 3/2003 | Lichtenhan et al. ........... 528/10 |

FOREIGN PATENT DOCUMENTS

WO   WO/2004/040371   5/2004

* cited by examiner

*Primary Examiner*—Kuo-Liang Peng
(74) *Attorney, Agent, or Firm*—David H. Jaffer; Pillsbury Winthrop Shaw Pittman LLP

(57) ABSTRACT

A synthesis process for polyhedral oligomeric silsesquioxanes that produces in high yield a low resin content, solvent free, and trace metal free monomer suitable for use in microelectronic applications. POSS silanols are reacted with a silane coupling agent in the presence of a solvent and a superbase.

15 Claims, 1 Drawing Sheet

PROCESS FOR HIGHLY PURIFIED POLYHEDRAL OLIGOMERIC SILSESQUIOXANE MONOMERS

CROSS-REFERENCE TO RELATED APPLICATIONS AND PATENTS

This application claims the benefit of U.S. Provisional Patent Application Ser. No. 60/634,249 filed on Dec. 7, 2004.

FIELD OF THE INVENTION

This invention relates generally to the process for enhancing the properties of acrylic and methacrylic photoresist compositions and, more particularly, to methods for the preparation of high purity nanostructured chemicals for incorporation into photoresist formulations and related microelectronic and medical products.

POSS nanostructured chemicals are desirable in photoresist formulations as they provide improved transparency, reduced line edge roughness, and reduced outgassing properties.

BACKGROUND OF THE INVENTION

It has long been recognized that the properties of polymers can be tailored to a high degree through variables such as polymer sequence, structure, additive and filler incorporation, composition, morphology, thermodynamic and kinetic processing control. It is similarly known that various sizes and shapes of fillers, and particulates (e.g. calcium carbonate, silica, carbon black etc.), and resins can also be incorporated into polymers or monomer mixtures to enhance their physical and material properties.

Polymer formulations useful in photoresists are highly engineered systems and thereby utilize nearly all of the prior known techniques for manipulation of properties. Additionally, photoresist polymers require high degrees of purity in order to perform their imaging and etch functions optimally and to ensure electronic circuit reliability. Recent art (WO 2004/040371) has focused on modifications of photoresists through the incorporation of nanostructured chemical entities known as POSS which provide filler type reinforcement but in the form of a soluble chemical entity. Optimal performance of photoresists can only be obtained through use of high purity POSS molecules.

Current engineering practices produce POSS molecules in high yield but they also require further refinement to render them suitable in photoresist applications. Prior methods discussed in U.S. patent application Ser. Nos. 09/631,892 and 10/186,318 (incorporated herein by reference) describe the utility of both protic acids and hydroxide containing bases to promote the silation of POSS silanols with silane coupling agents. While these approaches are known to be generally effective, they are limited in that protic acids and hydroxide bases can also catalyze the self condensation of POSS silanols into oligomerized resins (FIG. 1). Such resins are known as polysilsesquioxanes or T-resins and are not desirable in photoresists as their structure is molecularly imprecise, they contribute to blockiness and morphological irregularity, they increase viscosity, reduce shelf life, and cause difficulties in the filtration of photoresist formulations.

The keys that enable nanostructured chemicals to function as 1-10 nm reinforcing agents are: (1) their unique size with respect to polymer chain dimensions, and (2) their ability to be compatibilized with polymer systems to overcome repulsive forces that promote incompatibility and expulsion of the nanoreinforcing agent by the polymer chains. That is, nanostructured chemicals can be tailored to exhibit preferential affinity/compatibility with some polymer microstructures through variation of the R groups on each nanostructure. At the same time, the nanostructured chemicals can be tailored to be incompatible or compatible with other microstructures within the same polymer, thus allowing for selective reinforcement of specific polymer microstructure. Therefore, the factors to effect a selective nanoreinforcement include specific nanosizes of nanostructured chemicals, distributions of nanosizes, and compatibilities and disparities between the nanostrucutured chemical and the polymer system. For POSS, dispersion of the molecules and their compatibility with polymer segments is thermodynamically governed by the free energy of mixing equation ($\Delta G = \Delta H - T\Delta S$). The nature of the R group and ability of the reactive groups on the POSS cage to react or interact with polymers and surfaces greatly contributes to a favorable enthalpic ($\Delta H$) term while the entropic term ($\Delta S$) for POSS is highly favorable because of the monoscopic cage size and distribution of 1.0.

Nanostructured chemicals are best exemplified by those based on low-cost Polyhedral Oligomeric Silsesquioxanes (POSS) and Polyhedral Oligomeric Silicates (POS). POSS systems contain hybrid (i.e. organic-inorganic) compositions in which the internal cage like framework is primarily comprised of inorganic silicon-oxygen bonds. The exterior of the nanostructure is covered by both reactive and nonreactive organic functionalities (R), which ensure compatibility and tailorability of the nanostructure with organic monomers and polymers. These and other properties and features of nanostructured chemicals are discussed in detail in U.S. Pat. No. 5,412,053 and U.S. Pat. No. 5,484,867 to Lichtenhan et al., which are expressly incorporated herein by reference in their entirety.

Consequently a need exists for improvement upon the prior art methods of POSS silations which result in the formation of nanostructured monomers. An improved process yielding, higher purity, and molecularily precise silated POSS systems is described.

SUMMARY OF THE INVENTION

The present invention describes improved synthetic methods of preparing POSS compositions of the type $[(R^1SiO_{1.5})_8(R^2R^3R^4SiO_1)]_{\Sigma 9}$, $[((R^1SiO_{1.5})_8)_2(R^2R^3SiO_2)]_{\Sigma 17}$, $[((R^1SiO_{1.5})_8)_3(R^2SiO_3)]_{\Sigma 25}[(R^1SiO_{1.5})_6(R^1SiO_1)_2(R^2R^3R^4SiO)_2]_{\Sigma 10}$, $[(R^1SiO_{1.5})_6(R^1SiO_1)_2(R^2R^3SiO_2)]_{\Sigma 9}$, $[(R^1SiO_{1.5})_6(R^1HOSiO_1)_1(R^2R^3SiO)]_{\Sigma 8}$, $[(R^1SiO_{1.5})_6(R^1(R^2R^3R^4SiO)SiO_1)(R^2R^3SiO)]_{\Sigma 9}$, $[(R^1SiO_{1.5})_4(R^1(R^2R^3R^4SiO)SiO_1)_3]_{\Sigma 10}$, $[(R^1SiO_{1.5})_7(R^2SiO_{1.5})_1]_{\Sigma 8}$ with low resin content, and which are free of solvent and trace metals. These formula are of interest in and of themselves and are especially preferred for use in microelectronic applications.

The preferred process involves the reaction of POSS silanols of the formula $[(R^1SiO_{1.5})_7(HOSiO_{1.5})_1]_{\Sigma 8}$, $[(R^1SiO_{1.5})_6(R^1HOSiO_1)_2]_{\Sigma 8}$, $[(R^1SiO_{1.5})_4(R^1HOSiO_1)_3]_{\Sigma 7}$ with a silane coupling agent of the formula, $R^2R^3R^4SiX$, $R^2R^3SiX_2$, $R^2SiX_3$ in the presence of a solvent and superbase.

DEFINITION OF FORMULA REPRESENTATIONS FOR NANOSTRUCTURES

Figure 1:
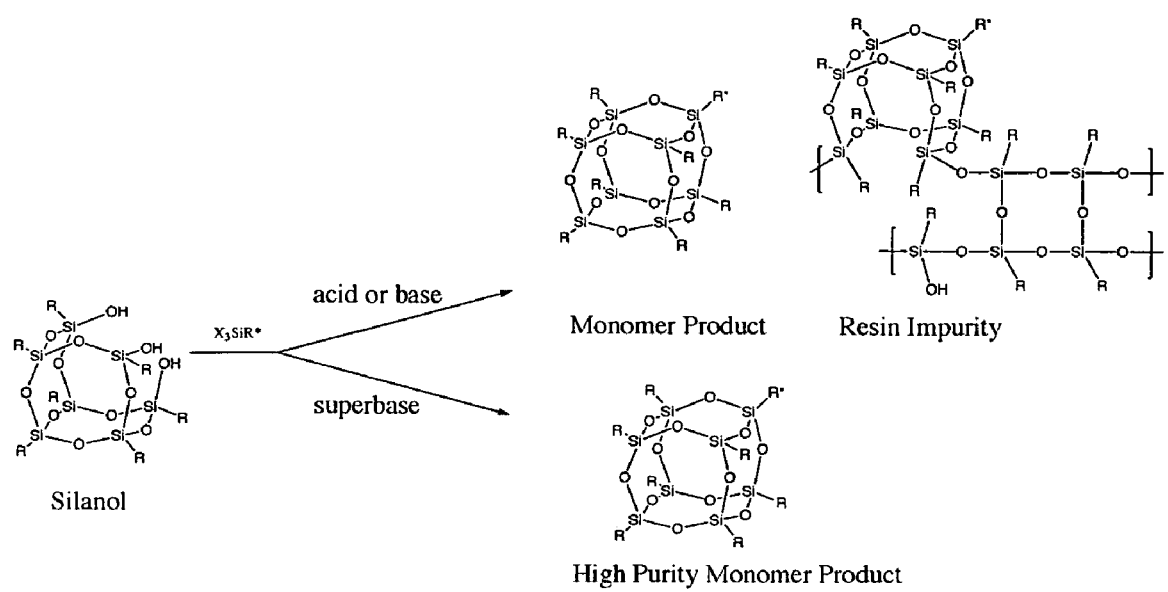
FIG. 1 shows a comparison of the prior art and improved silation process.

For the purposes of understanding this invention's chemical compositions the following definition for formula representations of Polyhedral Oligomeric Silsesquioxane (POSS) and Polyhedral Oligomeric Silicate (POS) nanostructures is made.

Polysilsesquioxanes are materials represented by the formula $[RSiO_{1.5}]_\infty$ where $\infty$ represents molar degree of polymerization and R=represents an organic substituent (H, siloxy, cyclic or linear aliphatic, or aromatic groups that may additionally contain reactive functionalities such as alcohols, esters, amines, ketones, olefins, ethers or halides or which may contain fluorinated groups). Polysilsesquioxanes may be either homoleptic or heteroleptic. Homoleptic systems contain only one type of R group while heteroleptic systems contain more than one type of R group. POSS and POS nanostructure compositions are represented by the formula:

$[(RSiO_{1.5})_n]_{\Sigma\#}$ for homoleptic compositions $[(RSiO_{1.5})_n(R'SiO_{1.5})_m]_{\Sigma\#}$ for heteroleptic compositions (where R≠R')

$[(RSiO_{1.5})_n(RXSiO_{1.0})_m]_{\Sigma\#}$ for functionalized heteroleptic compositions (where R groups can be equivalent or not equivalent)

In all of the above R is the same as defined above and X includes but is not limited to OH, Cl, Br, I, alkoxide (OR), acetate (OCOR), acid (OCOH), ester (OCOR), peroxide (OOR), amine ($NR_2$) isocyanate (NCO), and R. The symbols m and n refer to the stoichiometry of the composition. The symbol $\Sigma$ indicates that the composition forms a nanostructure and the symbol # refers to the number of silicon atoms contained within the nanostructure. The value for # is usually the sum of m+n, where n ranges typically from 1 to 24 and m ranges typically from 1 to 12. It should be noted that $\Sigma\#$ is not to be confused as a multiplier for determining stoichiometry, as it merely describes the overall nanostructural characteristics of the system (aka cage size).

DETAILED DESCRIPTION OF THE PREFERRED-EMBODIMENT

The present invention teaches an improved method of synthesis for silation of POSS nanostructured chemicals rending a higher purity and lower cost production methods than previously described.

POSS silanols (for example, of the formula $[(R^1SiO_{1.5})_7(HOSiO_{1.5})_1]_{\Sigma 8}$, $[(R^1SiO_{1.5})_6(R^1HOSiO_1)_2]_{\Sigma 8}$, $[(R^1SiO_{1.5})_4(R^1HOSiO_1)_3]_{\Sigma 7}$) may be reacted with a silane coupling agent (for example of the formula, $R^2R^3R^4SiX$, $R^2R^3SiX_2$, $R^2SiX_3$) in the presence of a solvent and superbase. The elimination of HX occurs and renders a monofunctional POSS monomer of the formula such as $[(R^1SiO_{1.5})_8(R^2R^3R^4SiO_1)]_{\Sigma 9}$, $[((R^1SiO_{1.5})_8)_2(R^2R^3SiO_2)]_{\Sigma 7}$, $[((R^1SiO_{1.5})_8)_3(R^2SiO_3)]_{\Sigma 25}$ $[(R^1SiO_{1.5})_6(R^1SiO_1)_1(R^2R^3R^4SiO)_2]_{\Sigma 10}$, $[(R^1SiO_{1.5})_6(R^1SiO_1)(R\ 2R^3SiO_2)]_{\Sigma 9}$, $[(R^1SiO_{1.5})_6(R^1HOSiO_1)_1(R^2R^3SiO)]_{\Sigma 8}$, $[(R^1SiO_{1.5})_6(R^1(R^2R^3R^4SiO)SiO_1)(R^2R^3SiO)]_{\Sigma 9}$, $[(R^1SiO_{1.5})_4(R^1(R^2R^3R^4SiO)SiO_1)_3]_{\Sigma 10}$, $[(R^1SiO_{1.5})_7(R^2SiO_{1.5})_1]_{\Sigma 8}$, respectively. The resulting monomer is essentially free of impurities and has controllable properties through selection of composition, R groups, and nanostructure size and topology. Highly purified nanostructured POSS monomers are desirable as they exhibit improved filtration capability, reduced contamination and viscosity, more reliable polymerization, lower cost and waste reduction over impure systems.

The key enablement of the invention is the use of phosphazene superbases to catalyze the silation of POSS silanols. A range of phosphazenes are applicable and include polyphosphazenes which vary in molecular weight and composition. Phosphazene oligomers and molecules are preferentially utilized and in particular P1 type P(NtBu)(NH2)3, P2 type (H2N)3P=N—P(NH2)4, P3 type (H2N)3P=N—P(NH2)-N=P(NH2)3, P4 type $(H_2N)3P=N—P(NH2)3=N—P(NH2)3—N=P(NH2)3$. The basicity of phosphazene super bases increase with increasing number of phosphorous atoms and this provides a valuable tool in the utility of this reagent. The preferred concentration of superbase relative to trisilanol is 2 mol % but a useful range includes 0.1 mol % to 10 mol %.

General Process Variables Applicable to All Processes

As is typical with chemical processes there are a number of variables that can be used to control the purity, selectivity, rate and mechanism of any process. Variables influencing the process include the size, polydispersity, and composition of the nanostructured chemical; the solvent, separation and isolation methods; and use of catalyst or cocatalysts. Additionally, kinetic and thermodynamic means of control, synthesis mechanism, rate, and product distribution are also known tools of the trade that can impact product quality and economics.

EXAMPLE

Synthesis of $[(EtSiO_{1.5})_7(methacrylpropylSiO_{1.0})_1]_{\Sigma 8}$ $[(EtSiO_{1.5})_4(Et(OH)SiO_{1.0})_3]_{\Sigma 7}$ (476 g, 0.8 mole) was dissolved in methanol (1405 mL) followed by addition of methacrylpropyltrimethoxysilane (198.68 g, 0.8 mole) and the solution was cooled to 0° C. Phosphazene superbase (FW 234.32, 15.72 mmol) was then added and the mixture stirred for 3 days at 0° C. The solution was then quenched with acetic acid (1.5 g) stirred and filtered. The solid was washed with methanol (1400 ml) and dried to render 415 g of pure white product in 69% yield.

The invention claimed is:

1. A method for preparing a POSS monomer comprising reacting a POSS silanol with a silane coupling agent in the presence of a solvent and a phosphazene superbase.

2. The method of claim 1, wherein a mixture of different POSS silanols is reacted.

3. The method of claim 1, wherein mixture of different phosphazene superbases is utilized.

4. The method according to claim 1, wherein a mixture of different solvents is utilized.

5. The method of claim 1 using a continuous silation process with the phosphazene superbase as a heterogeneous catalyst or coreagent.

6. The method of claim 1 wherein the POSS monomer is selected from the group consisting of $[(RSiO_{1.5})_7(HOSiO_{1.5})_1]_{\Sigma 8}$, $[(RSiO_{1.5})_6(RHOSiO_1)_2]_{\Sigma 8}$, and $[(RSiO_{1.5})_4(RHOSiO_1)_3]_{\Sigma 7}$, wherein:

R is selected from the group consisting of hydrogen, siloxy, and aliphatic, aromatic, and olefinic groups, wherein said groups may contain reactive functionalities selected from the group consisting of alcohols, esters, amines, ketones, olefins, ethers, and halides, and may contain fluorinated subtituents; and each R may be the same or different.

7. The method of claim 1 wherein the silane coupling agent is elected from the group consisting of $R_3SiX$, $R_2SiX_2$, and $RSiX_3$, wherein:

R is selected from the group consisting of hydrogen, siloxy, and aliphatic, aromatic, and olefinic groups, wherein said groups may contain reactive functionalities selected from the group consisting of alcohols, esters, amines, ketones, olefins, ethers, and halides, and may contain fluorinated subtituents;

X is selected from the group consisting of OH, Cl, Br, I, alkoxide (OR), formate, acetate (OCOR), acid (OCOH), ester (OCOR), peroxide (OOR), amine (NR$_2$), isocyanate (NCO), and R; and each R and each X may be the same or different.

8. The method of claim 1 wherein the phosphazene is selected from the group consisting of P1 type, P2 type, P3 type, and P4 type.

9. The method of claim 8 using a continuous silation process with the phosphazene superbase as a heterogeneous catalyst or coreagent.

10. The method of claim 8 wherein the silane coupling agent is elected from the group consisting of R$_3$SiX, R$_2$SiX$_2$, and RSiX$_3$, wherein:

R is selected from the group consisting of hydrogen, siloxy, and aliphatic, aromatic, and olefinic groups, wherein said groups may contain reactive functionalities selected from the group consisting of alcohols, esters, amines, ketones, olefins, ethers, and halides, and may contain fluorinated substituents;

X is selected from the group consisting of OH, Cl, Br, I, alkoxide (OR), formate, acetate (OCOR), acid (OCOH), ester (OCOR), peroxide (OOR), amine (NR$_2$), isocyanate (NCO), and R; and each R and each X may be the same or different.

11. The method of claim 10 wherein the POSS monomer is selected from the group consisting of [(RSiO$_{1.5}$)$_7$(HOSiO$_{1.5}$)$_1$]$_{\Sigma 8}$, [(RSiO$_{1.5}$)$_6$(RHOSiO$_1$)$_2$]$_{\Sigma 8}$, and [(RSiO$_{1.5}$)$_4$(RHOSiO$_1$)$_3$]$_{\Sigma 7}$, wherein a continuous process rendering functionalized POSS monomers is utilized that uses the superbase as a heterogeneous catalyst or coreagent, wherein R is selected from the group consisting of hydrogen, siloxy, and aliphatic, aromatic, and olefinic groups, wherein said groups may contain reactive functionalities selected from the group consisting of alcohols, esters, amines, ketones, olefins, ethers, and halides, and may contain fluorinated substituents.

12. The method of claim 9 wherein the silane coupling agent is selected from the group consisting of R$_3$SiX, R$_2$SiX$_2$, and RSiX$_3$, wherein:

R is selected from the group consisting of hydrogen, siloxy, and aliphatic, aromatic, and olefinic groups, wherein said groups may contain reactive functionalities selected from the group consisting of alcohols, esters, amines, ketones, olefins, ethers, and halides, and may contain fluorinated substituents;

X is selected from the group consisting of OH, Cl, Br, I, alkoxide (OR), formate, acetate (OCOR), acid (OCOH), ester (OCOR), peroxide (OOR), amine (NR$_2$), isocyanate (NCO), and R; and each R and each X may be the same or different.

13. The method of claim 12 wherein the POSS monomer is selected from the group consisting of [(RSiO$_{1.5}$)$_7$(HOSiO$_{1.5}$)$_1$]$_{\Sigma 8}$, [(RSiO$_{1.5}$)$_6$(RHOSiO$_1$)$_2$]$_{\Sigma 8}$, and [(RSiO$_{1.5}$)$_4$(RHOSiO$_1$)$_3$]$_{\Sigma 7}$, and wherein R is selected from the group consisting of hydrogen, siloxy, and aliphatic, aromatic, and olefinic groups, wherein said groups may contain reactive functionalities selected from the group consisting of alcohols, esters, amines, ketones, olefins, ethers, and halides, and may contain fluorinated substituents.

14. The method of claim 9 wherein the POSS monomer is selected from the group consisting of [(RSiO$_{1.5}$)$_7$(HOSiO$_{1.5}$)$_1$]$_{\Sigma 8}$, [(RSiO$_{1.5}$)$_6$(RHOSiO$_1$)$_2$]$_{\Sigma 8}$, and [(RSiO$_{1.5}$)$_4$(RHOSiO$_1$)$_3$]$_{\Sigma 7}$, wherein:

R is selected from the group consisting of hydrogen, Siloxy, and aliphatic, aromatic, and olefinic groups, wherein said groups may contain reactive functionalities selected from the group consisting of alcohols, esters, amines, ketones, olefins, ethers, and halides, and may contain fluorinated subtituents; and each R may be the same or different.

15. The method of claim 8 wherein the POSS monomer is selected from the group consisting of [(RSiO$_{1.5}$)$_7$(HOSiO$_{1.5}$)$_1$]$_{\Sigma 8}$, [(RSiO$_{1.5}$)$_6$(RHOSiO$_1$)$_2$]$_{\Sigma 8}$, and [(RSiO$_{1.5}$)$_4$(RHOSiO$_1$)$_3$]$_{\Sigma 7}$, wherein a continuous process rendering functionalized POSS monomers is utilized that uses the superbase as a heterogeneous catalyst or coreagent, wherein R is selected from the group consisting of hydrogen, siloxy, and aliphatic, aromatic, and olefinic groups, wherein said groups may contain reactive functionalities selected from the group consisting of alcohols, esters, amines, ketones, olefins, ethers, and halides, and may contain fluorinated substituents.

* * * * *